(12) United States Patent
Palm et al.

(10) Patent No.: US 12,237,246 B2
(45) Date of Patent: Feb. 25, 2025

(54) SEMICONDUCTOR DEVICES INCLUDING PARALLEL ELECTRICALLY CONDUCTIVE LAYERS

(71) Applicant: Infineon Technologies AG, Neubiberg (DE)

(72) Inventors: Petteri Palm, Regensburg (DE); Robert Fehler, Regensburg (DE); Josef Hoeglauer, Heimstetten (DE); Angela Kessler, Sinzing (DE)

(73) Assignee: Infineon Technologies AG, Neubiberg (DE)

( * ) Notice: Subject to any disclaimer, the term of this patent is extended or adjusted under 35 U.S.C. 154(b) by 452 days.

(21) Appl. No.: 17/196,652

(22) Filed: Mar. 9, 2021

(65) Prior Publication Data
US 2021/0287964 A1  Sep. 16, 2021

(30) Foreign Application Priority Data
Mar. 10, 2020 (DE) ...................... 10 2020 106 518.3

(51) Int. Cl.
*H01L 23/485* (2006.01)
*H01L 23/00* (2006.01)
*H01L 23/31* (2006.01)

(52) U.S. Cl.
CPC ........ *H01L 23/485* (2013.01); *H01L 23/3107* (2013.01); *H01L 24/20* (2013.01); *H01L 2224/2101* (2013.01); *H01L 2224/221* (2013.01)

(58) Field of Classification Search
CPC ............. H01L 23/5389; H01L 23/3107; H01L 24/96; H01L 23/49844; H01L 23/485;
(Continued)

(56) References Cited

U.S. PATENT DOCUMENTS 7,781,877 B2 *  8/2010  Jiang ................... H01L 23/5389
                                                                  438/118
8,916,968 B2   12/2014  Mahler et al.
(Continued)

FOREIGN PATENT DOCUMENTS

CN       112204718 A  *  1/2021  ............. H01L 24/96
DE   10 2008 040 906     2/2010
(Continued)

*Primary Examiner* — Didarul A Mazumder
*Assistant Examiner* — Gustavo G Ramallo
(74) *Attorney, Agent, or Firm* — Dicke, Billig & Czaja, PLLC

(57) ABSTRACT

A semiconductor device is disclosed. In one example, the semiconductor device includes a semiconductor chip including a first chip contact pad on a first chip main surface. The semiconductor device further includes a first electrically conductive layer arranged over the first chip main surface and electrically coupled to the first chip contact pad, wherein the first electrically conductive layer extends in a direction parallel to the first chip main surface. An electrical through connection is electrically coupled to the first electrically conductive layer and to a second electrically conductive layer, wherein the electrical through connection extends in a direction perpendicular to the first chip main surface, and wherein, in a top view of the first chip main surface, the electrical through connection and the semiconductor chip are non-overlapping.

16 Claims, 5 Drawing Sheets

(58) Field of Classification Search
CPC ......... H01L 23/482; H01L 2224/06181; H01L 2224/2518; H01L 2224/221; H01L 2224/04105; H01L 2224/2101; H01L 2224/0603; H01L 24/20; H01L 23/00–4012; H01L 23/48–49894; H05K 1/185
USPC .......................................................... 257/774
See application file for complete search history.

(56) References Cited

U.S. PATENT DOCUMENTS

| | | | |
|---|---|---|---|
| 9,070,568 B2 | 6/2015 | Hosseini et al. | |
| 9,159,711 B2* | 10/2015 | Topaloglu | H01L 23/66 |
| 11,508,587 B2 | 11/2022 | Elsherbini et al. | |
| 2007/0268105 A1* | 11/2007 | Walls | H01L 23/49822 336/200 |
| 2011/0057308 A1* | 3/2011 | Choi | H01L 23/49811 257/E23.116 |
| 2011/0156232 A1* | 6/2011 | Youn | H01L 23/3128 257/E25.027 |
| 2011/0291256 A1 | 12/2011 | Rainer et al. | |
| 2013/0221526 A1 | 8/2013 | Lange et al. | |
| 2013/0328213 A1* | 12/2013 | Otremba | H01L 23/5389 257/773 |
| 2017/0077022 A1* | 3/2017 | Scanlan | H01L 24/19 |
| 2017/0271260 A1* | 9/2017 | Wojnowski | H01L 23/5226 |
| 2019/0006341 A1* | 1/2019 | Lin | H01L 21/563 |
| 2019/0326255 A1* | 10/2019 | Olson | H01L 21/78 |
| 2020/0035683 A1* | 1/2020 | Sharma | H01L 24/17 |
| 2020/0105677 A1* | 4/2020 | Chiba | H01L 23/5386 |

FOREIGN PATENT DOCUMENTS

| | | | | |
|---|---|---|---|---|
| DE | 10 2013 103 085 | | 10/2013 | |
| DE | 10 2014 109 909 | | 1/2015 | |
| DE | 10 2018 111 989 | | 11/2019 | |
| EP | 3 547 359 | | 10/2019 | |
| EP | 3547359 | A1 * | 10/2019 | ......... H01L 21/4846 |
| WO | 2019/132955 | | 7/2019 | |

* cited by examiner

SEMICONDUCTOR DEVICES INCLUDING PARALLEL ELECTRICALLY CONDUCTIVE LAYERS

CROSS-REFERENCE TO RELATED APPLICATION

This Utility patent application claims priority to German Patent Application No. 10 2020 106 518.3, filed Mar. 10, 2020, which is incorporated herein by reference.

TECHNICAL FIELD

The present disclosure relates to semiconductor technology in general. More particular, the present disclosure relates to semiconductor devices including parallel electrically conductive layers. In addition, the present disclosure relates to methods for manufacturing such semiconductor devices.

BACKGROUND

Semiconductor chips may be arranged in protective packages to allow easy handling and assembly on circuit boards and to protect the semiconductor chips from damage. In standard semiconductor packages the semiconductor chips are oftentimes arranged on a leadframe and encapsulated by a molding compound. Manufacturers of semiconductor devices are constantly striving to improve their products and methods for manufacturing thereof. It may be desirable to develop semiconductor devices with improved electrical and thermal performance compared to standard semiconductor devices. In addition, it may be desirable to provide cost-effective methods for manufacturing such semiconductor devices.

SUMMARY

An aspect of the present disclosure relates to a semiconductor device. The semiconductor device comprises a semiconductor chip comprising a first chip contact pad on a first chip main surface. The semiconductor device further comprises a first electrically conductive layer arranged over the first chip main surface and electrically coupled to the first chip contact pad, wherein the first electrically conductive layer extends in a direction parallel to the first chip main surface. The semiconductor device further comprises a second electrically conductive layer arranged over the first electrically conductive layer and electrically coupled to the first electrically conductive layer, wherein the second electrically conductive layer extends in a direction parallel to the first electrically conductive layer. The semiconductor device further comprises an electrical through connection electrically coupled to the first electrically conductive layer and to the second electrically conductive layer, wherein the electrical through connection extends in a direction perpendicular to the first chip main surface, and wherein, in a top view of the first chip main surface, the electrical through connection and the semiconductor chip are non-overlapping.

An aspect of the present disclosure relates to a method for manufacturing a semiconductor device. The method comprises providing a semiconductor chip comprising a first chip contact pad on a first chip main surface. The method further comprises forming a first electrically conductive layer arranged over the first chip main surface and electrically coupled to the first chip contact pad, wherein the first electrically conductive layer extends in a direction parallel to the first chip main surface. The method further comprises forming a second electrically conductive layer arranged over the first electrically conductive layer and electrically coupled to the first electrically conductive layer, wherein the second electrically conductive layer extends in a direction parallel to the first electrically conductive layer. The method further comprises forming an electrical through connection electrically coupled to the first electrically conductive layer and to the second electrically conductive layer, wherein the electrical through connection extends in a direction perpendicular to the first chip main surface, and wherein, in a top view of the first chip main surface, the electrical through connection and the semiconductor chip are non-overlapping.

BRIEF DESCRIPTION OF THE DRAWINGS

The accompanying drawings are included to provide a further understanding of aspects. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference numerals may designate corresponding similar parts.

DETAILED DESCRIPTION

In the following detailed description, reference is made to the accompanying drawings, in which are shown by way of illustration specific aspects in which the disclosure may be practiced. In this regard, directional terminology, such as "top", "bottom", "front", "back", etc. may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the concept of the present disclosure. Hence, the following detailed description is not to be taken in a limiting sense.

Figure 1:
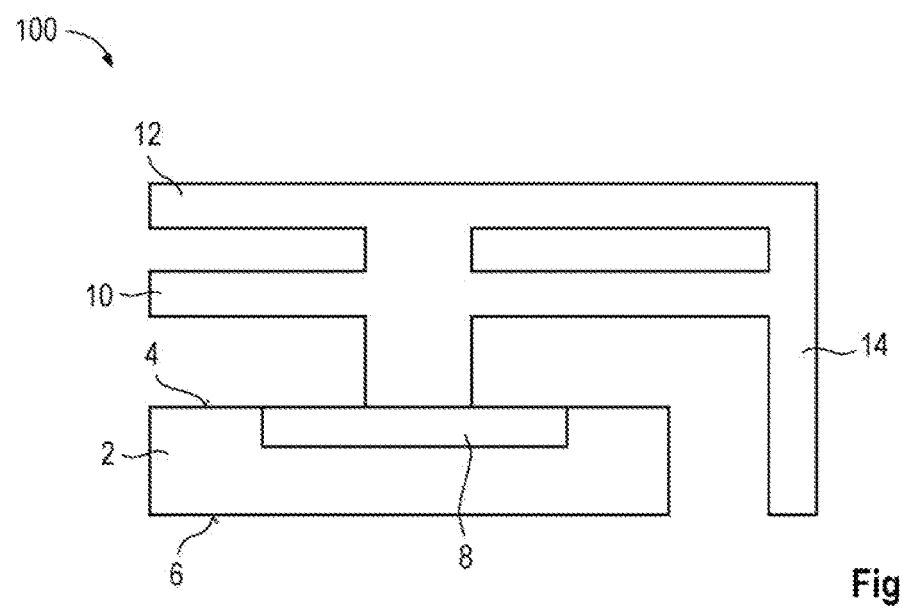
FIG. 1 schematically illustrates a cross-sectional side view of a semiconductor device 100 in accordance with the disclosure.

FIG. 1 schematically illustrates a cross-sectional side view of a semiconductor device 100 in accordance with the disclosure. The semiconductor device 100 is illustrated in a general manner in order to qualitatively specify aspects of the disclosure. It is understood that the semiconductor device 100 may include further aspects which are not illustrated for the sake of simplicity. For example, the semiconductor device 100 may be extended by any of the aspects described in connection with other semiconductor devices and methods in accordance with the disclosure.

The semiconductor device 100 may include a semiconductor chip 2 with a first chip main surface 4 and a second chip main surface 6 arranged opposite to the first chip main surface 4. A chip contact pad 8 may be arranged on or at the first chip main surface 4. The semiconductor device 100 may further include a first electrically conductive layer 10 arranged over the first chip main surface 4 and electrically coupled to the chip contact pad 8. The first electrically conductive layer 10 may extend in a direction parallel to the first chip main surface 4, i.e. in the x-direction. In the example of FIG. 1, an electrical coupling between the chip contact pad 8 and the first electrically conductive layer 10 is exemplarily illustrated by a single vertical connection element. In further examples, such electrical coupling may be provided differently.

The semiconductor device 100 may further include a second electrically conductive layer 12 arranged over and electrically coupled to the first electrically conductive layer 10. The second electrically conductive layer 12 may extend in a direction parallel to the first electrically conductive layer 10, i.e. in the x-direction. In the example of FIG. 1, an electrical coupling between the first electrically conductive layer 10 and the second electrically conductive layer 12 is exemplarily illustrated by a single vertical connection element. In further examples, such electrical coupling may be provided differently.

The semiconductor device 100 may further include an electrical through connection 14 electrically coupled to the first electrically conductive layer 10 and to the second electrically conductive layer 12. The electrical through connection 14 may extend in a direction perpendicular to the first chip main surface 4, i.e. in the y-direction. In a top view of the first chip main surface 4, i.e. when viewed in the z-direction, the electrical through connection 14 and the semiconductor chip 2 may be non-overlapping.

Figure 2:
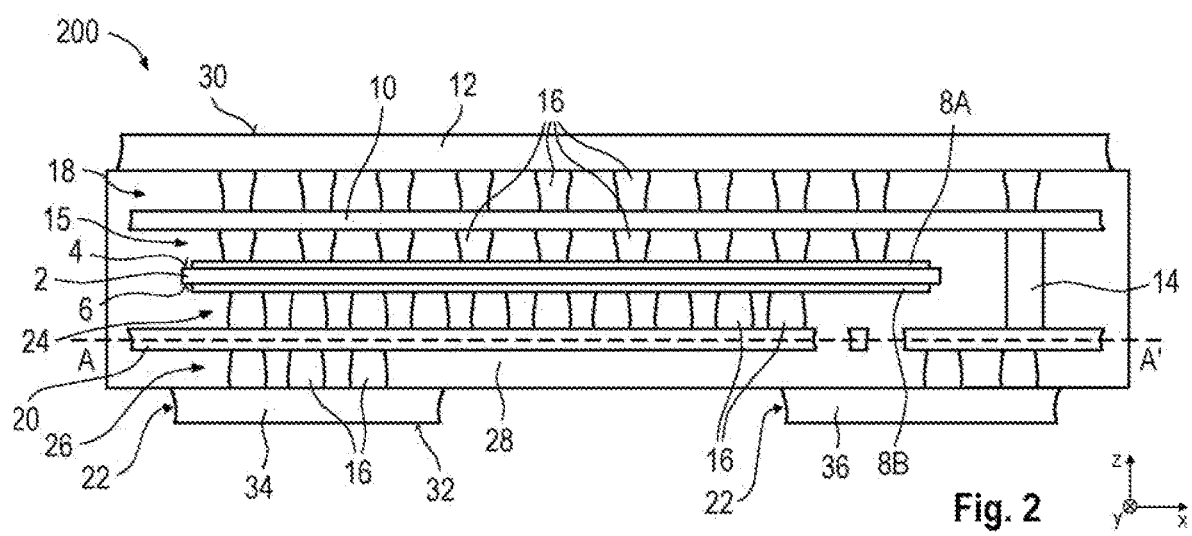
FIG. 2 schematically illustrates a cross-sectional side view of a semiconductor device 200 in accordance with the disclosure.

FIG. 2 schematically illustrates a cross-sectional side view of a semiconductor device 200 in accordance with the disclosure. The semiconductor device 200 can be seen as a more detailed version of the semiconductor device 100 of FIG. 1.

The semiconductor device 200 may include a semiconductor chip 2. In one example, the semiconductor chip 2 may be manufactured from an elemental semiconductor material (e.g. Si). In a further example, the semiconductor chip 2 may be manufactured from a wide band gap semiconductor material or a compound semiconductor material (e.g. SiC, GaN, SiGe, GaAs). In particular, the semiconductor chip 2 may include a power semiconductor. Power semiconductor chips may be used in any kind of power application like e.g. MOSFETs (Metal Oxide Semiconductor Field Effect Transistors), half bridge circuits, power modules including a gate driver, etc. For example, power semiconductor chips may include or may be part of a power device like e.g. a power MOSFET, an LV (low voltage) power MOSFET, a power IGBT (Insulated Gate Bipolar Transistor), a power diode, a superjunction power MOSFET, etc. A power semiconductor element may e.g. have a supply voltage of more than about 20V.

The semiconductor chip 2 may include two chip main surfaces, i.e. a top chip surface 4 and a bottom chip surface 6. A first contact pad 8A and a second contact pad 8B may be arranged on the top chip surface 4 and the bottom chip surface 6, respectively. In the example of FIG. 2, the semiconductor chip 2 may include or may correspond to a power transistor, such as e.g. a power MOSFET. In this case, the first contact pad 8A may be a drain contact pad of the power transistor, and the second contact pad 8B may be a source contact pad of the power transistor. For example, the drain contact pad 8A may cover the top chip surface 4 for more than about 80 percent, or even for more than about 90 percent. The semiconductor chip 2 may further include a gate contact pad which may be, for example, arranged on the bottom chip surface 6, but which may be not visible in FIG. 2 due to the chosen perspective.

The semiconductor chip 2 may have a vertical structure, i.e. the semiconductor chip 2 may be fabricated such that electric currents may substantially flow in a direction perpendicular to the main faces of the semiconductor chip 2, i.e. in the z-direction. A semiconductor chip 2 having a vertical structure may have electrodes over its two main faces, i.e. over its top side and bottom side. In particular, power semiconductor chips may have a vertical structure and may have load electrodes arranged over both main faces. For example, the source electrode and gate electrode of a power MOSFET may be arranged over one face while the drain electrode of the power MOSFET may be arranged over the other face. In a further example, a power HEMT may be configured as a vertical power semiconductor chip. Yet further examples for a vertical power semiconductor chip are a PMOS (P-Channel Metal Oxide semiconductor) or an NMOS (N-Channel Metal Oxide semiconductor).

The semiconductor device 200 may include a first electrically conductive layer 10 arranged over the top chip surface 4 of the semiconductor chip 2 and electrically coupled to the first chip contact pad 8A. The first electrically conductive layer 10 may continuously extend parallel to the top chip surface 4 and may thus be configured to continuously carry an electrical current in the x-direction. In general, the first electrically conductive layer 10 may be manufactured from at least one of a metal or a metal alloy. More particular, the first electrically conductive layer 10 may be manufactured from at least one of copper or a copper alloy.

The electrically conductive layer 10 may have the shape of a conductor plane. That is, the first electrically conductive layer 10 may be not necessarily formed as a conductor line substantially extending in only a single direction. Rather, the first electrically conductive layer 10 may extend in the x-direction and in the y-direction to a substantially similar extent. When viewed in the z-direction, the first electrically conductive layer 10 may cover the top chip surface 4 of the semiconductor chip 2 for more than about 50 percent, or more than about 60 percent, or more than about 70 percent, or more than about 80 percent, or even more than about 90 percent. A thickness of the first electrically conductive layer 10 in the z-direction may lie in a range from about 15 micrometer to about 45 micrometer, more particular from about 20 micrometer to about 40 micrometer. In the example of FIG. 2, the top surface and the bottom surface of the first electrically conductive layer 10 may be substantially planar such that the thickness of the first electrically conductive layer 10 may be substantially constant over its entire dimension.

The semiconductor device 200 may include a second electrically conductive layer 12 arranged over and electrically coupled to the first electrically conductive layer 10. The second electrically conductive layer 12 may at least partly be similar to the first electrically conductive layer 10 such that above comments on the first electrically conductive layer 10 may also hold true for the second electrically conductive layer 12. With respect to the z-direction, a thickness of the first electrically conductive layer 10 may be smaller than a thickness of the second electrically conductive layer 12. A thickness of the second electrically conductive layer 12 in the z-direction may lie in a range from about 30 micrometer to 90 micrometer, more particular from about 35 micrometer to about 65 micrometer.

The semiconductor device 200 may include a first via array 15 arranged between and electrically coupling the first chip contact pad 8A and the first electrically conductive layer 10. In particular, the first via array 15 may include a plurality of via connections 16 electrically connecting the top surface of the first chip contact pad 8A and the bottom surface of the first electrically conductive layer 10. In general, the first via array 15 may be manufactured from at least one of a metal or a metal alloy. More particular, the first via array 15 may be manufactured from at least one of copper or a copper alloy. For example, the via connections 16 of the first via array 15 may include at least one of microvia connections or PTH (plated through hole) via connections. The first via array 15 may cover the first chip contact pad 8A more than about 5 percent, or more than about 10 percent, or more than about 20 percent, or more than about 30 percent, or more than about 40 percent, or more than about 50 percent, or even more than about 60 percent. The number of via connections 16 of the first via array 15 may depend on the size of the via connections 16 and the size of the first contact pad 8A and may be tens or even hundreds. The via connections 16 may be distributed over the first contact pad 8A in a regular pattern.

The semiconductor device 200 may include a second via array 18 arranged between and electrically coupling the first electrically conductive layer 10 and the second electrically conductive layer 12. The second via array 18 may be at least partly similar to the first via array 15 such that above comments on the first via array 15 may also hold true for the second via array 18. When viewed in the z-direction, via connections 16 of the first via array 15 and via connections 16 of the second via array 18 may be arranged congruently.

The semiconductor device 200 may include an electrical through connection 14 electrically coupled to the first electrically conductive layer 10 and to the second electrically conductive layer 12. The electrical through connection 14 may continuously extend in a direction perpendicular to the top chip surface 4 of the semiconductor chip 2 and may thus be configured to continuously carry an electrical current in the z-direction. In the side view of FIG. 2, the electrical through connection 14 and the semiconductor chip 2 may be arranged side by side. That is, when viewed in the z-direction, the electrical through connection 14 and the semiconductor chip 2 may be non-overlapping. In the example of FIG. 2, the electrical through connection 14 may be formed by stacked via connections, such as e.g. microvia connections or PTH via connections. The electrical through connection 14 may be referred to as through package via connection. In the example of FIG. 2, only one through package connection may be visible due to the chosen perspective. However, the electrical through connection 14 may also include more than only one through package via connection, as can e.g. be seen in the cross-sectional bottom view of FIG. 8.

The semiconductor device 200 may include a third electrically conductive layer 20 arranged over the bottom chip surface 6 of the semiconductor chip 2 and electrically coupled to the second chip contact pad 8B. The third electrically conductive layer 20 may be at least partly similar to the first electrically conductive layer 10 such that above comments on the first electrically conductive layer 10 may also hold true for the third electrically conductive layer 20. In particular, with respect to the z-direction, a thickness of the third electrically conductive layer 20 may be similar to a thickness of the first electrically conductive layer 10.

The semiconductor device 200 may include a fourth electrically conductive layer 22 arranged over the bottom surface of the third electrically conductive layer 20. The fourth electrically conductive layer 22 may at least partly be similar to the second electrically conductive layer 12 such that above comments on the second electrically conductive layer 12 may also hold true for the fourth electrically conductive layer 22. In particular, with respect to the z-direction, a thickness of the fourth electrically conductive layer 22 may be similar to a thickness of the second electrically conductive layer 12.

The semiconductor device 200 may include a third via array 24 arranged between and electrically coupling the second chip contact pad 8B and the third electrically conductive layer 20. Furthermore, the semiconductor device 200 may include a fourth via array 26 arranged between and electrically coupling the third electrically conductive layer 20 and the fourth electrically conductive layer 22. When viewed in the z-direction, via connections 16 of the third via array 24 and via connections 16 of the fourth via array 26 may be arranged congruently. Each of the third via array 24 and the fourth via array 26 may at least partly be similar to e.g. the first via array 15 such that above comments on the first via array 15 may also hold true for the via arrays 24 and 26.

The semiconductor device 200 may include a laminate 28, wherein one or more components of the semiconductor device 200 may be embedded in the laminate 28. The semiconductor device 200 may thus also be referred to as semiconductor package. In the example of FIG. 2, all of the previously described components may be at least partly encapsulated by the material of the laminate 28. For example, the laminate 28 may include an epoxy laminate material which may be glass-reinforced. In particular, the laminate may include an FR4 laminate. A more detailed structure and layup of an exemplary laminate 28 is shown and described in FIG. 7. The laminate 28 and/or the first and second electrically conductive layers 10, 12 may have a mechanical robustness which may provide a sufficient mechanical support for the semiconductor device 200. Additional support structures, such as e.g. a leadframe or the like, may thus not be required.

The semiconductor device 200 may include a first device main surface 30 and a second device main surface 32 arranged opposite to the first device main surface 30. In the example of FIG. 2, the upper surface of the second electrically conductive layer 12 may form at least a part of the upper device main surface 30. The upper surface of the second electrically conductive layer 12 may be uncovered by the laminate 28. In the example of FIG. 2, the upper surface of the second electrically conductive layer 12 may be uncovered by any other (in particular solid) material. In further examples, a heatsink (not illustrated) may be arranged over the upper surface of the second electrically conductive layer 12 for cooling purposes. In particular, the upper surface of the second electrically conductive layer 12 may provide a full top side copper pad for good thermal connection. Heat produced during an operation of the semiconductor device 200 may be dissipated and directed towards the heatsink.

The fourth electrically conductive layer 22 may include a first device contact pad 34 and a second device contact pad 36. Each of the device contact pads 34 and 36 may be arranged at the bottom device surface 32. In the example of FIG. 2, the bottom surfaces of the device contact pads 34 and 36 may be uncovered by the laminate 28. In the example of FIG. 2, the bottom surfaces of the device contact pads 34 and 36 may be uncovered by any other (in particular solid) material. In further examples, a solder material (not illustrated) may be arranged over the device contact pads 34 and 36 for electrically and mechanically connecting the semiconductor device 200 to a circuit board (not illustrated). The electrical redistribution structure formed by the electrically conductive layers and the via arrays arranged over the bottom surface of the semiconductor chip 2 may provide an easy optimization of the footprint of the semiconductor device 200.

The first chip contact pad 8A may be electrically coupled to the second device contact pad 36 via the electrically conductive layers 10, 12, the via arrays 15, 18 and the electrical through connection 14. Accordingly, an electrical current may be continuously redistributed from the first chip contact pad 8A to the second device contact pad 36 and/or vice versa. Here, the first electrically conductive layer 10 and the second electrically conductive layer 12 may be configured to carry the electrical current in parallel. Due to such electrical redistribution, a drain contact pad 8A of a power transistor may be made accessible at the second device contact pad 36. In a similar fashion, the second chip contact pad 8B may be electrically coupled to the first device contact pad 34 via the electrically conductive layer 20 and the via arrays 24, 26. A source contact pad 8B of a power transistor may thus be made accessible at the first device contact pad 34.

Figure 3:
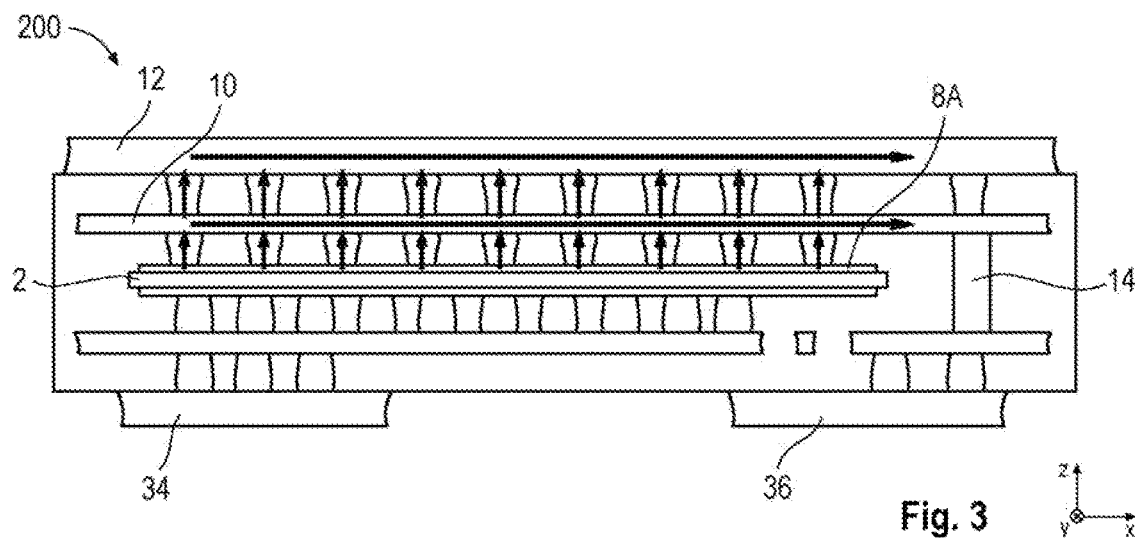
FIG. 3 schematically illustrates a feature of the semiconductor device 200 in accordance with the disclosure.

FIG. 3 schematically illustrates a feature of the semiconductor device 200 in accordance with the disclosure. In FIG. 3, electrical currents flowing from the first chip contact pad 8A (e.g. a drain contact pad) to the second device contact pad 36 are indicated by arrows. The electrical currents may inter alia flow in parallel through the first and second electrically conductive layers 10, 12. Compared to conventional semiconductor devices, in which a lateral routing of electrical currents may be provided by a single electrically conductive layer only, Ohmic losses and electrical resistivities may be reduced. As previously described, the first electrically conductive layer 10 may be thinner than the second electrically conductive layer 12. That is, the first electrically conductive layer 10 may provide for better design rules and lower plating costs.

Figure 4:
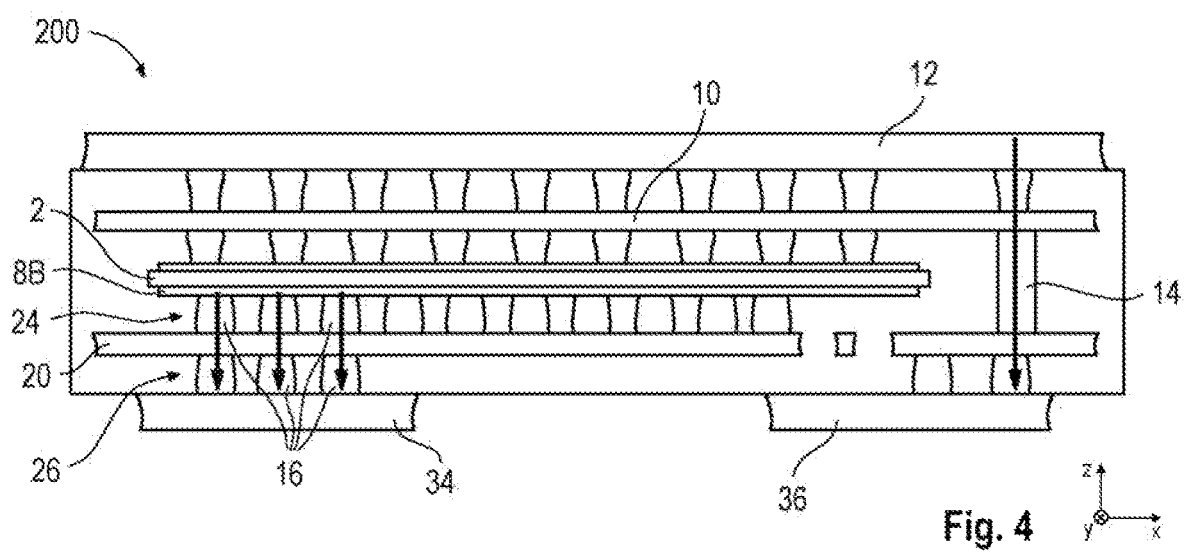
FIG. 4 schematically illustrates a feature of the semiconductor device 200 in accordance with the disclosure.

FIG. 4 schematically illustrates a feature of the semiconductor device 200 in accordance with the disclosure. In FIG. 4, electrical currents flowing from the second chip contact pad 8B (e.g. a source contact pad) to the first device contact pad 34 are indicated by arrows on the left. When viewed in the z-direction, via connections 16 of the third via array 24 and via connections 16 of the fourth via array 26 may be arranged congruently. The illustrated electrical currents may thus flow from the second chip contact pad 8B to the first device contact pad 34 the shortest way. No lateral current flow due to staggered via connections may occur. In FIG. 4, electrical currents flowing from the electrically conductive layers 10 and 12 to the second device contact pad 36 are indicated by an arrow on the right. Such current routing of the semiconductor device 200 may provide a direct vertical electrical connection providing a good thermal and electrical performance.

Figure 5:
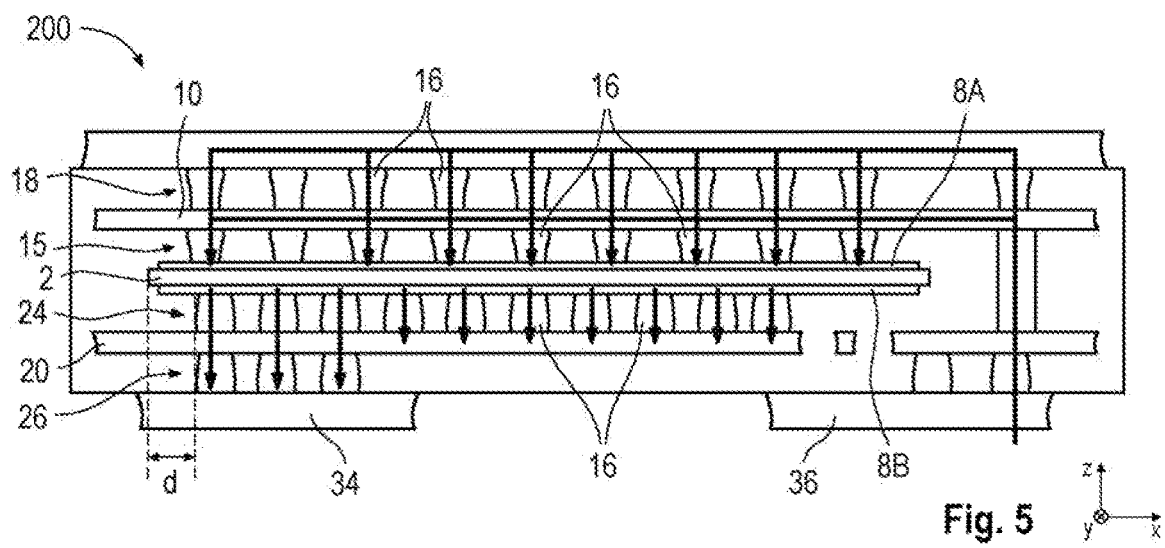
FIG. 5 schematically illustrates a feature of the semiconductor device 200 in accordance with the disclosure.

FIG. 5 schematically illustrates a feature of the semiconductor device 200 in accordance with the disclosure. In FIG. 5, electrical currents flowing between the chip contact pads 8A, 8B and the device contact pads 34, 36 are indicated by arrows. The electrical redistribution provides short and direct electrical connections between the chip contact pads 8A, 8B and a circuit board (not illustrated) on which the semiconductor device 200 may be mounted by the device contact pads 34, 36. Such optimized current flow may minimize parasitic effects and provide low inductances. It is to be noted that the short and direct electrical connections are inter alia provided by congruently arranging the via connections 16 of the first and second via arrays 15, 18 and/or by congruently arranging the via connections 16 of the third and fourth via arrays 24, 26.

Each of the via arrays 15 and 24 may include a dense arrangement of via connections 16, such as e.g. microvia connections. Due to such dense arrangement the contact pads 8A and 8B may be optimally contacted by the via arrays 15 and 24. For example, the via connections 16 may be inter alia arranged close to the edges of the semiconductor chip 2 such that small distances from peripheral via connections to the chip edges can be realized. In comparison, such small distances may be problematic to realize by using a clip attach. A minimum distance "d" from the via connections of e.g. the first via array 15 to an edge of the semiconductor chip 2 may lie in a range from about 50 micrometers to about 350 micrometers, more particular from about 75 micrometer to about 300 micrometer. Small distances from peripheral via connections to the chip edge may improve a thermal performance and high frequency behavior of the semiconductor device 200. In addition, via connections arranged close to the chip edges may be configured to carry large portions of electrical currents flowing through the via arrays 15 and 24.

Figure 6:
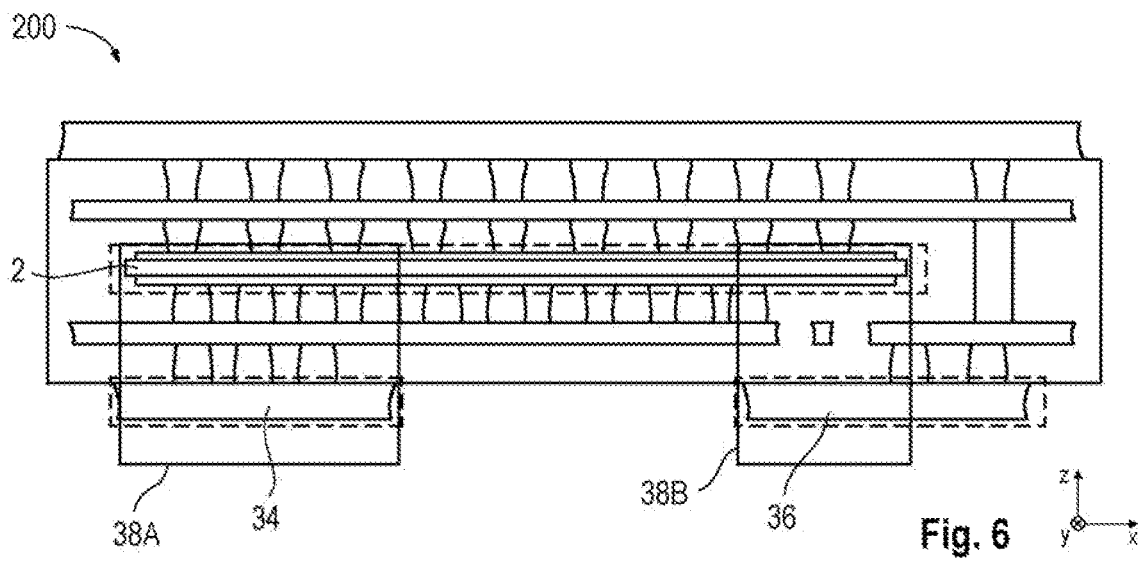
FIG. 6 schematically illustrates a feature of the semiconductor device 200 in accordance with the disclosure.

FIG. 6 schematically illustrates a feature of the semiconductor device 200 in accordance with the disclosure. In FIG. 6, the semiconductor chip 2, the first device contact pad 34 (e.g. a device source pad) and the second device contact pad 36 (e.g. a device drain pad) are surrounded by dashed rectangles. A first solid rectangle on the left illustrates a first overlap area 38A between the semiconductor chip 2 and the first device contact pad 34. In a similar fashion, a second solid rectangle on the right illustrates a second overlap area 38B between the semiconductor chip 2 and the second device contact pad 36. When viewed in the z-direction, the semiconductor chip 2 may at least partly overlap with the first device contact pad 34 and/or with the second device contact pad 36. The overlap areas 38A and 38B may provide a possibility of reducing a size of the semiconductor device 200 in the x- and y-direction. In addition, a footprint of the semiconductor device 200 and the footprints of the device contact pads 34 and 36 may be optimized.

Figure 7:
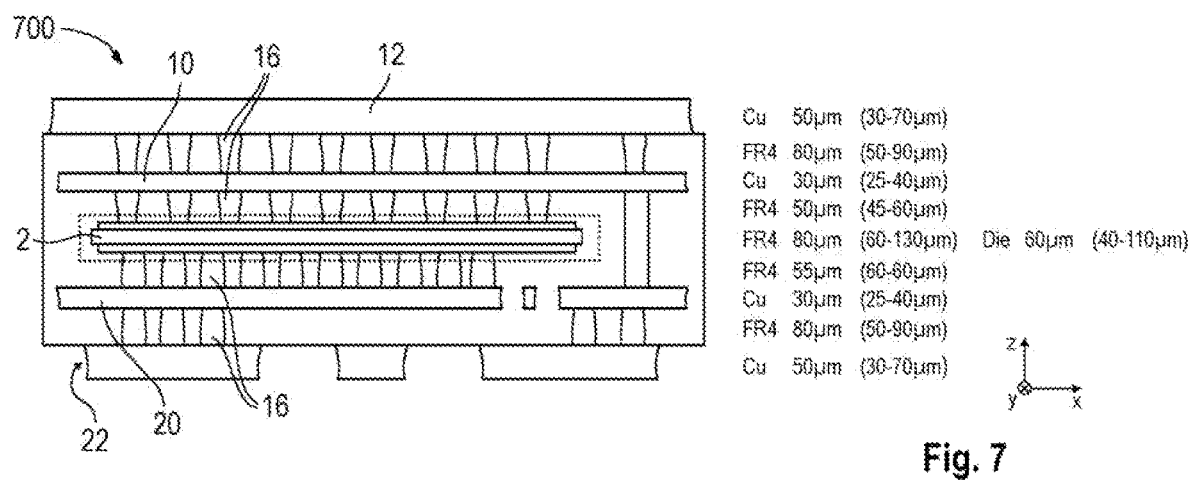
FIG. 7 schematically illustrates a cross-sectional side view of a semiconductor device 700 in accordance with the disclosure.

FIG. 7 schematically illustrates a cross-sectional side view of a semiconductor device 700 in accordance with the disclosure. The semiconductor device 700 may be at least partly similar to the semiconductor device 200 of FIG. 2. FIG. 7 illustrates dimensions of components forming a semiconductor device in accordance with the disclosure.

Information provided by FIG. 7 may also hold true for other semiconductor devices in accordance with the disclosure as described herein.

FIG. 7 includes information on the materials of the components forming the semiconductor device 700. The semiconductor device 700 may include a middle FR4 layer in which the semiconductor chip 2 may be embedded. The middle FR4 layer may cover the side surfaces of the semiconductor chip 2. The semiconductor device 700 may further include multiple further FR4 layers arranged above and below the middle FR4 layer. In particular, the FR4 based PCB material may include only a small halogen content, such as e.g. a small chlorine content. For example, the middle FR4 layer and the further FR4 layers of FIG. 7 may at least partly form the material of the laminate 28 of FIG. 2. The semiconductor device 700 may further include multiple copper layers or copper foils arranged above and below the middle FR4 layer and between the further FR4 layers. For example, the copper layers may at least partly form the electrically conductive layers 10, 12, 20 and 22 of FIG. 2.

FIG. 7 includes a first table providing exemplary values for the thicknesses of the illustrated material layers. In addition, a second table provides exemplary value ranges for the thicknesses of the material layers. For example, a thickness of the middle FR4 layer may lie in a range from about 60 micrometer to about 130 micrometer. In the example of FIG. 7, the thickness of the middle FR4 layer may have an exemplary value of about 80 micrometer.

An expected overall thickness or height of the semiconductor device 700 in the z-direction may lie in a range from about 380 micrometers to about 600 micrometers, or from about 410 micrometers to about 600 micrometers, or from about 490 micrometers to about 600 micrometers. Compared to conventional semiconductor devices, the semiconductor devices in accordance with the disclosure may thus provide a reduced height in the z-direction. The reduced height may provide a possibility for arranging additional components, such as e.g. passives, over one or more of the main device surfaces.

In FIG. 7, a dashed rectangle indicates an area around the semiconductor chip 2. In the example of FIG. 7, the indicated area may be free of glass fibers. The layers arranged outside of the rectangle may include glass fibers. A size (or depth) in the z-direction of the via connections 16 arranged on the upper surface of the semiconductor chip 2 may lie in a range from about 55 micrometers to about 60 micrometers. A size (or depth) in the z-direction of the via connections 16 arranged on the lower surface of the semiconductor chip 2 may lie in a range from about 60 micrometers to about 65 micrometers. A size of the semiconductor chip 2 in the z-direction may lie in a range from about 40 micrometer to about 110 micrometer and may have an exemplary value of 60 micrometer.

Figure 8:
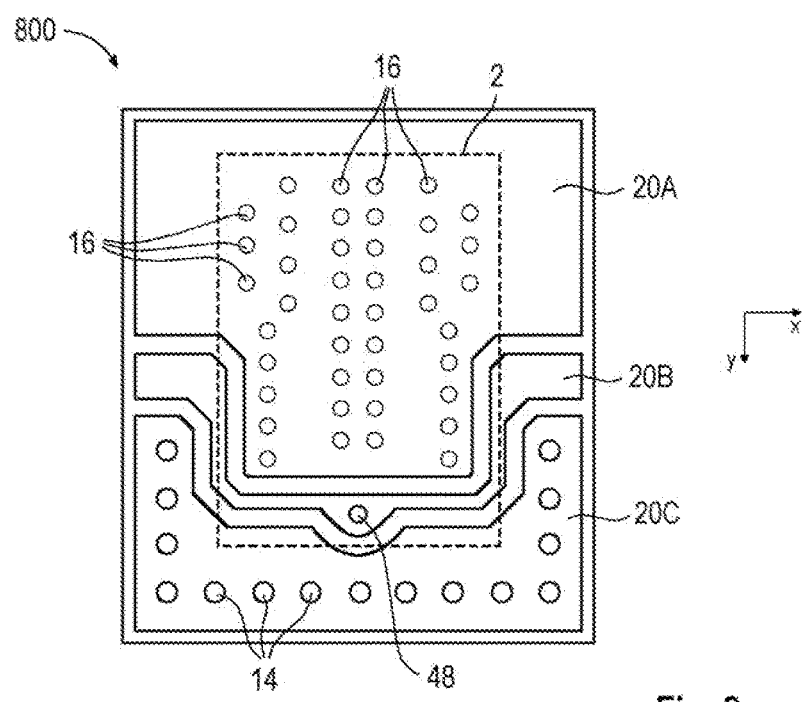
FIG. 8 schematically illustrates a cross-sectional bottom view of a semiconductor device 800 in accordance with the disclosure.

FIG. 8 schematically illustrates a cross-sectional bottom view of a semiconductor device 800 in accordance with the disclosure. The semiconductor device 800 may be similar to the semiconductor device 200 discussed in previous figures. In particular, the cross-sectional bottom view of FIG. 8 may be similar to a bottom view of a cross-section along a plane A-A' of the semiconductor device 200 of FIG. 2.

The semiconductor device 800 may include a semiconductor chip 2 which is indicated by a dashed rectangle. The size of the semiconductor chip 2 in FIG. 8 is exemplary and may differ in further examples. In the example of FIG. 8, the semiconductor chip 2 may include a transistor with a gate pad, a source pad and a drain pad. FIG. 8 shows three portions 20A, 20B and 20C of an electrically conductive layer. The first portion 20A may be electrically coupled to the source pad of the semiconductor chip 2, the second portion 20B may be electrically connected to the gate pad of the semiconductor chip 2, and the third portion 20C may be electrically connected to the drain pad of the semiconductor chip 2. In the example of FIG. 8, the first portion 20A may be formed in a T-shape, while the third portion 20C may be formed in a U-shape. The second portion 20B may be arranged between the first portion 20A and the third portion 20C and may thus have a shape adapted to the shapes of the first portion 20A and the third portion 20C.

FIG. 8 shows a via array of multiple via connections 16 providing an electrical connection between the first portion 20A of the electrically conductive layer and the source pad of the semiconductor chip 2. The number of via connections 16 in FIG. 8 is exemplary and may differ in further examples. Referring back to FIG. 2, the via connections 16 may e.g. correspond to the third via array 24. The via connections 16 may provide a large source pad coverage. For example, the via connections 16 may cover the source contact pad of the semiconductor chip 2 more than 5 percent, or more than about 10 percent, or more than about 20 percent, or more than about 30 percent, or more than about 40 percent, or more than about 50 percent, or even more than about 60 percent. The via connections 16 may be uniformly distributed over the source pad. In particular, the via connections 16 may be arranged on flat areas of the source pad. Uneven areas of the source pad, which may be caused by gate runners or (polyimide) passivation, may remain uncovered. It is to be noted that the same may hold true for via connections contacting the gate contact pad and the drain contact pad of the semiconductor chip 2. Placing the via connections 16 only on flat areas of the respective chip contact pad may minimize reflections during laser drilling which may cause non-ideal or misshaped via shapes.

FIG. 8 shows multiple electrical through connections 14 providing at least a part of an electrical coupling between the drain contact pad of the semiconductor chip 2 and a footprint of the semiconductor device 800. The number of electrical through connections 14 in FIG. 8 is exemplary and may differ in further examples. The electrical through connections 14 may correspond to similar components shown in FIG. 2. In the example of FIG. 8, the electrical through connections 14 may be arranged in a U-shape, thereby at least partly surrounding the semiconductor chip 2. As discussed in connection with foregoing figures, the electrical through connections 14 may contribute to minimizing electrical resistances in the semiconductor device 800.

FIG. 8 shows a via connection 48 providing an electrical connection between the second portion 20B of the electrically conductive layer and the gate pad of the semiconductor chip 2. In the example of FIG. 8, only one via connection 48 is shown. In further examples, the number of via connections 48 may differ.

Figure 9:
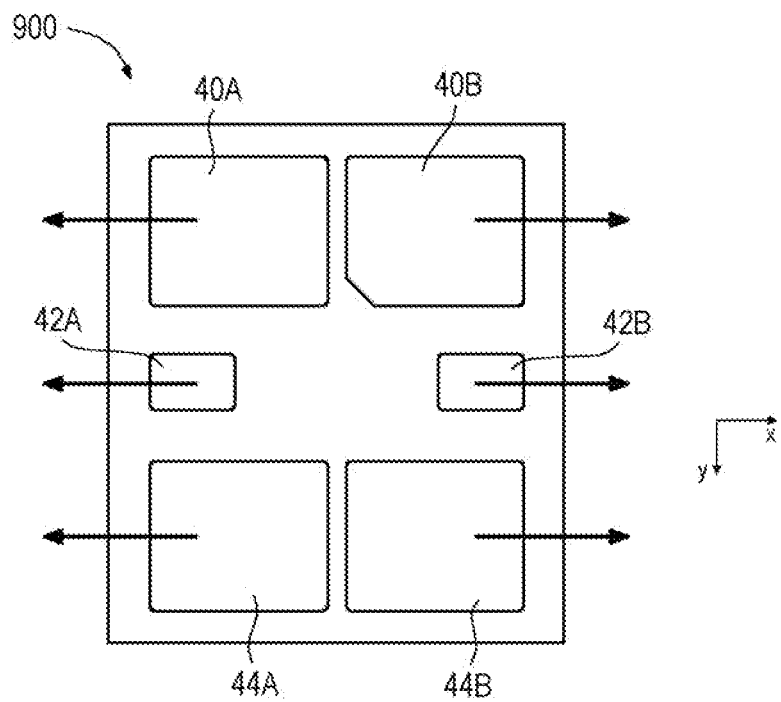
FIG. 9 schematically illustrates a bottom view of a semiconductor device 900 in accordance with the disclosure.

FIG. 9 schematically illustrates a bottom view of a semiconductor device 900 in accordance with the disclosure. For example, the semiconductor device 900 may be similar to any of the semiconductor devices previously discussed and vice versa. The semiconductor device 900 may include multiple device contact pads arranged at a bottom surface of the semiconductor device 900. In the example of FIG. 9, the semiconductor device 900 may include two source contact pads 40A, 40B, two gate contact pads 42A, 42B and two drain contact pads 44A, 44B. The contact pads may be arranged symmetrically such that electrical currents may be routed in two different directions, for example in the positive x-direction and in the negative x-direction (see arrows).

Using multiple contact pads may support a solder inspection (LTI, lead tip inspection). For example, a solder inspection based on two gate contact pads 42A, 42B as shown in the example of FIG. 9 may be easier to perform compared to a solder inspection based on only one gate contact pad arranged in the center of the device's bottom surface.

Figure 10:
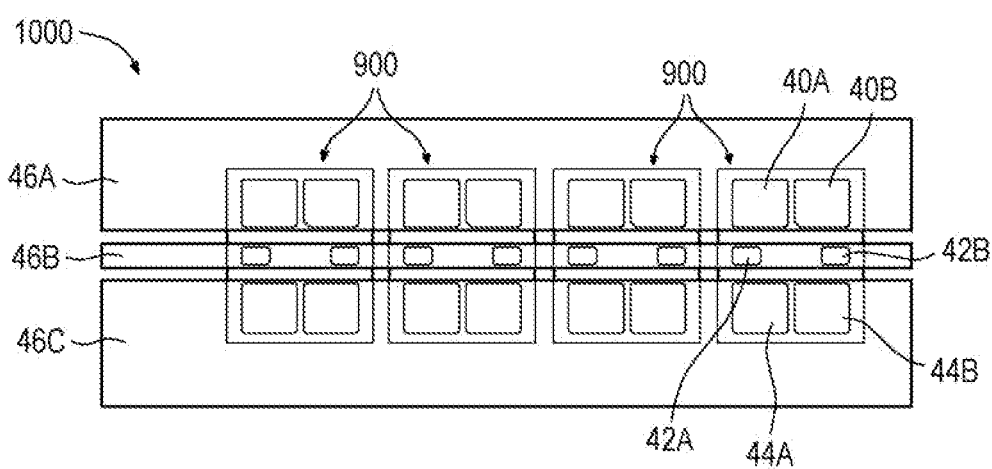
FIG. 10 schematically illustrates a top view of an assembly 1000 including multiple semiconductor devices in accordance with the disclosure.

FIG. 10 schematically illustrates a top view of an assembly 1000 including multiple semiconductor devices in accordance with the disclosure. For example, each of the semiconductor devices may be similar to the semiconductor device 900 of FIG. 9. The assembly 1000 may include multiple signal lines 46A, 46B and 46C which may be configured to electrically couple the contact pads of the semiconductor devices 900. In particular, the first signal line 46A may be configured to electrically couple the source contact pads 40A, 40B of the semiconductor devices 900, the second signal line 46B may be configured to electrically couple the gate contact pads 42A, 42B of the semiconductor devices 900, and the third signal line 46B may be configured to electrically couple the drain contact pads 44A, 44B of the semiconductor devices 900. As can be seen from FIG. 10, the footprint design of the semiconductor devices 900 may provide an easy parallelization of multiple power MOSFETs arranged on a board.

Figure 11:
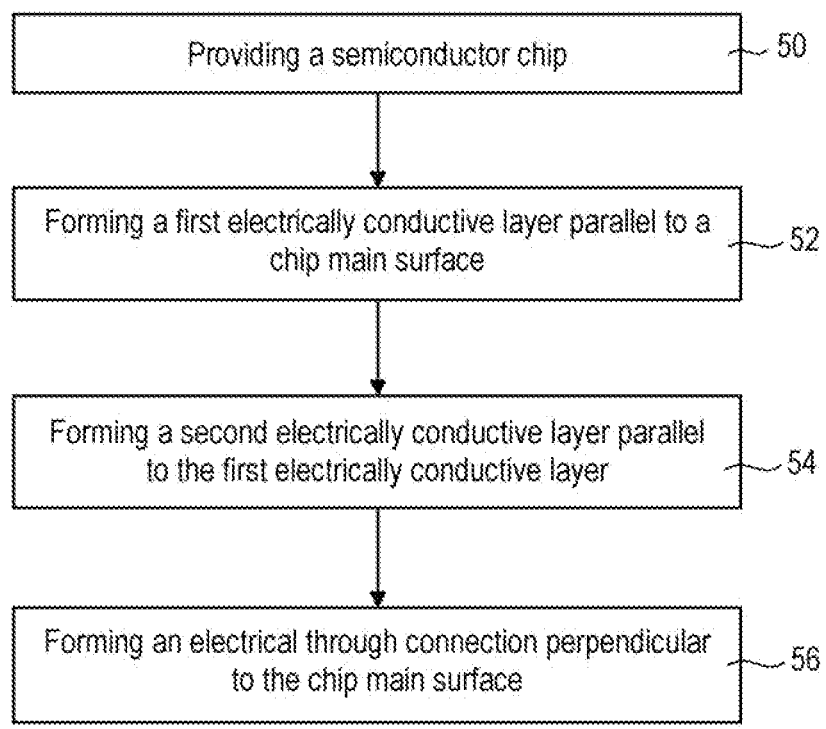
FIG. 11 illustrates a flowchart of a method for manufacturing a semiconductor device in accordance with the disclosure.

FIG. 11 illustrates a flowchart of a method for manufacturing a semiconductor device in accordance with the disclosure. The method is described in a general manner in order to qualitatively specify aspects of the disclosure. The method of FIG. 11 may include further aspects. For example, the method of FIG. 11 may be extended by any of the aspects described in connection with other examples in accordance with the disclosure.

At 50, a semiconductor chip including a first chip contact pad on a first chip main surface may be provided. At 52, a first electrically conductive layer arranged over the first chip main surface and electrically coupled to the first chip contact pad may be formed. The first electrically conductive layer may extend in a direction parallel to the first chip main surface. At 54, a second electrically conductive layer arranged over the first electrically conductive layer and electrically coupled to the first electrically conductive layer may be formed. The second electrically conductive layer may extend in a direction parallel to the first electrically conductive layer. At 56, an electrical through connection electrically coupled to the first electrically conductive layer and to the second electrically conductive layer may be formed. The electrical through connection may extend in a direction perpendicular to the first chip main surface. In a top view of the first chip main surface, the electrical through connection and the semiconductor chip may be non-overlapping.

EXAMPLES

In the following, semiconductor devices including parallel electrically conductive layers and methods for manufacturing such semiconductor devices will be explained by means of examples.

Example 1 is a semiconductor device, comprising: a semiconductor chip comprising a first chip contact pad on a first chip main surface; a first electrically conductive layer arranged over the first chip main surface and electrically coupled to the first chip contact pad, wherein the first electrically conductive layer extends in a direction parallel to the first chip main surface; a second electrically conductive layer arranged over the first electrically conductive layer and electrically coupled to the first electrically conductive layer, wherein the second electrically conductive layer extends in a direction parallel to the first electrically conductive layer; and an electrical through connection electrically coupled to the first electrically conductive layer and to the second electrically conductive layer, wherein the electrical through connection extends in a direction perpendicular to the first chip main surface, and wherein, in a top view of the first chip main surface, the electrical through connection and the semiconductor chip are non-overlapping.

Example 2 is a semiconductor device according to Example 1, wherein the first electrically conductive layer and the second electrically conductive layer are configured to carry an electrical current in parallel between the first chip contact pad and the electrical through connection.

Example 3 is a semiconductor device according to Example 1 or 2, wherein the semiconductor chip comprises a power transistor and the first chip contact pad comprises a drain contact pad of the power transistor.

Example 4 is a semiconductor device according to one of the preceding Examples, further comprising: a first device main surface, wherein the first chip main surface faces the first device main surface; and a second device main surface arranged opposite to the first device main surface, wherein the electrical through connection is electrically coupled to a first device contact pad arranged at the second device main surface.

Example 5 is a semiconductor device according to one of the preceding Examples, further comprising: a laminate, wherein at least the semiconductor chip, the first electrically conductive layer and the electrical through connection are embedded in the laminate.

Example 6 is a semiconductor device according to one of the preceding Examples, wherein a surface of the second electrically conductive layer facing away from the first chip main surface is exposed.

Example 7 is a semiconductor device according to one of the preceding Examples, wherein, in a top view of the first chip main surface, the first electrically conductive layer covers more than 50 percent of the first chip main surface.

Example 8 is a semiconductor device according to one of the preceding Examples, wherein, in a direction perpendicular to the first chip main surface, a thickness of the first electrically conductive layer is smaller than a thickness of the second electrically conductive layer.

Example 9 is a semiconductor device according to one of the preceding Examples, wherein, in a direction perpendicular to the first chip main surface, a thickness of the first electrically conductive layer lies in a range from 15 micrometer to 45 micrometer.

Example 10 is a semiconductor device according to one of the preceding Examples, wherein, in a direction perpendicular to the first chip main surface, a thickness of the second electrically conductive layer lies in a range from 30 micrometer to 90 micrometer.

Example 11 is a semiconductor device according to one of the preceding Examples, further comprising: a first via array electrically coupling the first chip contact pad and the first electrically conductive layer.

Example 12 is a semiconductor device according to Example 11, wherein the first via array covers more than 5 percent of the first chip contact pad.

Example 13 is a semiconductor device according to Example 11 or 12, wherein a minimum distance between the first via array and an edge of the semiconductor chip lies in a range from about 50 micrometers to about 350 micrometers.

Example 14 is a semiconductor device according to one of the preceding Examples, further comprising: a second via array electrically coupling the first electrically conductive layer and the second electrically conductive layer.

Example 15 is a semiconductor device according to Example 14, wherein, in a top view of the first chip main surface, via connections of the first via array and via connections of the second via array are arranged congruently.

Example 16 is a semiconductor device according to one of the preceding Examples, further comprising: a second chip contact pad arranged on a second chip main surface opposite to the first chip main surface; and a third electrically conductive layer arranged over the second chip main surface and electrically coupled to the second chip contact pad, wherein the third electrically conductive layer extends in a direction parallel to the second chip main surface.

Example 17 is a semiconductor device according to Example 16, further comprising: a third via array electrically coupling the second chip contact pad and the third electrically conductive layer.

Example 18 is a semiconductor device according to Example 16 or 17, further comprising: a second device contact pad arranged at the second device main surface; and a fourth via array electrically coupling the third electrically conductive layer and the second device contact pad.

Example 19 is a semiconductor device according to Example 18, wherein, in a top view of the first chip main surface, via connections of the third via array and via connections of the fourth via array are arranged congruently.

Example 20 is a semiconductor device according to one of Examples 4 to 19, wherein, in a top view of the first chip main surface, the semiconductor chip and the first device contact pad at least partly overlap.

Example 21 is a method for manufacturing a semiconductor device, wherein the method comprises: providing a semiconductor chip comprising a first chip contact pad on a first chip main surface; forming a first electrically conductive layer arranged over the first chip main surface and electrically coupled to the first chip contact pad, wherein the first electrically conductive layer extends in a direction parallel to the first chip main surface; forming a second electrically conductive layer arranged over the first electrically conductive layer and electrically coupled to the first electrically conductive layer, wherein the second electrically conductive layer extends in a direction parallel to the first electrically conductive layer; and forming an electrical through connection electrically coupled to the first electrically conductive layer and to the second electrically conductive layer, wherein the electrical through connection extends in a direction perpendicular to the first chip main surface, and wherein, in a top view of the first chip main surface, the electrical through connection and the semiconductor chip are non-overlapping.

As employed in this specification, the terms "connected", "coupled", "electrically connected", and/or "electrically coupled" may not necessarily mean that elements must be directly connected or coupled together. Intervening elements may be provided between the "connected", "coupled", "electrically connected", or "electrically coupled" elements.

Further, the word "over" used with regard to e.g. a material layer formed or located "over" a surface of an object may be used herein to mean that the material layer may be located (e.g. formed, deposited, etc.) "directly on", e.g. in direct contact with, the implied surface. The word "over" used with regard to e.g. a material layer formed or located "over" a surface may also be used herein to mean that the material layer may be located (e.g. formed, deposited, etc.) "indirectly on" the implied surface with e.g. one or multiple additional layers being arranged between the implied surface and the material layer.

Furthermore, to the extent that the terms "having", "containing", "including", "with", or variants thereof are used in either the detailed description or the claims, such terms are intended to be inclusive in a manner similar to the term "comprising". That is, as used herein, the terms "having", "containing", "including", "with", "comprising", and the like are open-ended terms that indicate the presence of stated elements or features, but do not preclude additional elements or features. The articles "a", "an", and "the" are intended to include the plural as well as the singular, unless the context clearly indicates otherwise.

Moreover, the word "exemplary" is used herein to mean serving as an example, instance, or illustration. Any aspect or design described herein as "exemplary" is not necessarily to be construed as advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or multiple" unless specified otherwise or clear from context to be directed to a singular form. Also, at least one of A and B or the like generally means A or B or both A and B.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures.

Although the disclosure has been shown and described with respect to one or multiple implementations, equivalent alterations and modifications will occur to others skilled in the art based at least in part upon a reading and understanding of this specification and the annexed drawings. The disclosure includes all such modifications and alterations and is limited only by the concept of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or multiple other features of the other implementations as may be desired and advantageous for any given or particular application.

The invention claimed is:
1. A semiconductor device, comprising:
a semiconductor chip comprising a first chip contact pad on a first chip main surface and a second chip contact pad on a second chip main surface opposite to the first chip main surface;
a first electrically conductive layer arranged over the first chip main surface and electrically coupled to the first chip contact pad, wherein the first electrically conductive layer extends in a direction parallel to the first chip main surface;
a second electrically conductive layer arranged over the first electrically conductive layer and electrically coupled to the first electrically conductive layer, wherein the second electrically conductive layer extends in a direction parallel to the first electrically conductive layer;
an electrical through connection electrically coupled directly to the first electrically conductive layer and directly to the second electrically conductive layer, wherein the electrical through connection extends in a direction perpendicular to the first chip main surface, and wherein, in a top view of the first chip main surface, the electrical through connection and the semiconductor chip are non-overlapping;
a first via array electrically coupling the first chip contact pad and the first electrically conductive layer;
a second via array electrically coupling the first electrically conductive layer and the second electrically conductive layer, such that the electrical through connection is directly electrically coupled to the first chip contact pad by the first and second electrically conductive layers and the first and second via arrays;
a third electrically conductive layer arranged under the second chip main surface and electrically coupled to the second chip contact pad, wherein the third electrically conductive layer extends in a direction parallel to the second chip main surface; and
a fourth electrically conductive layer arranged under the third electrically conductive layer and electrically coupled to the third electrically conductive layer, wherein the fourth electrically conductive layer extends in a direction parallel to the third electrically conductive layer,
wherein a surface of the second electrically conductive layer facing away from the first chip main surface is completely exposed, and
wherein, in a top view of the first chip main surface, via connections of the first via array and via connections of the second via array are aligned.

2. The semiconductor device of claim 1, wherein the first electrically conductive layer and the second electrically conductive layer are configured to carry an electrical current in parallel between the first chip contact pad and the electrical through connection.

3. The semiconductor device of claim 1, wherein the semiconductor chip comprises a power transistor and the first chip contact pad comprises a drain contact pad of the power transistor.

4. The semiconductor device of claim 1, further comprising:
a first device main surface, wherein the first chip main surface faces the first device main surface; and
a second device main surface arranged opposite to the first device main surface, wherein the fourth electrically conductive layer comprises a first device contact pad, and wherein the electrical through connection is electrically coupled to the first device contact pad arranged at the second device main surface.

5. The semiconductor device of claim 4, wherein, in a top view of the first chip main surface, the semiconductor chip and the first device contact pad at least partly overlap.

6. The semiconductor device of claim 4, further comprising:
a third via array electrically coupling the second chip contact pad and the third electrically conductive layer.

7. The semiconductor device of claim 6, further comprising:
wherein the fourth electrically conductive layer comprises a second device contact pad arranged at the second device main surface; and
a fourth via array electrically coupling the third electrically conductive layer and the second device contact pad.

8. The semiconductor device of claim 7, wherein, in a top view of the first chip main surface, via connections of the third via array and via connections of the fourth via array are aligned.

9. The semiconductor device of claim 1, further comprising:
a laminate, wherein at least the semiconductor chip, the first electrically conductive layer and the electrical through connection are embedded in the laminate.

10. The semiconductor device of claim 1, wherein, in a top view of the first chip main surface, the first electrically conductive layer covers more than 50 percent of the first chip main surface.

11. The semiconductor device of claim 1, wherein, in a direction perpendicular to the first chip main surface, a thickness of the first electrically conductive layer is smaller than a thickness of the second electrically conductive layer.

12. The semiconductor device of claim 1, wherein, in a direction perpendicular to the first chip main surface, a thickness of the first electrically conductive layer lies in a range from 15 micrometer to 45 micrometer.

13. The semiconductor device of claim 1, wherein, in a direction perpendicular to the first chip main surface, a thickness of the second electrically conductive layer lies in a range from 30 micrometer to 90 micrometer.

14. The semiconductor device of claim 1, wherein the first via array covers more than 5 percent of the first chip contact pad.

15. The semiconductor device of claim 1, wherein a minimum distance between the first via array and an edge of the semiconductor chip lies in a range from about 50 micrometers to about 350 micrometers.

16. Method for manufacturing a semiconductor device, wherein the method comprises:
providing a semiconductor chip comprising a first chip contact pad on a first chip main surface and a second chip contact pad on a second chip main surface opposite to the first chip main surface;
forming a first electrically conductive layer arranged over the first chip main surface and electrically coupled to the first chip contact pad, wherein the first electrically conductive layer extends in a direction parallel to the first chip main surface;
forming a second electrically conductive layer arranged over the first electrically conductive layer and electrically coupled to the first electrically conductive layer, wherein the second electrically conductive layer extends in a direction parallel to the first electrically conductive layer;

forming an electrical through connection electrically coupled directly to the first electrically conductive layer and directly to the second electrically conductive layer, wherein the electrical through connection extends in a direction perpendicular to the first chip main surface, and wherein, in a top view of the first chip main surface, the electrical through connection and the semiconductor chip are non-overlapping;

forming a first via array electrically coupling the first chip contact pad and the first electrically conductive layer;

forming a second via array electrically coupling the first electrically conductive layer and the second electrically conductive layer, such that the electrical through connection is directly electrically coupled to the first chip contact pad by the first and second electrically conductive layers and the first and second via arrays;

forming a third electrically conductive layer arranged under the second chip main surface and electrically coupled to the second chip contact pad, wherein the third electrically conductive layer extends in a direction parallel to the second chip main surface; and forming a fourth electrically conductive layer arranged under the third electrically conductive layer and electrically coupled to the third electrically conductive layer, wherein the fourth electrically conductive layer extends in a direction parallel to the third electrically conductive layer, wherein a surface of the second electrically conductive layer facing away from the first chip main surface is completely exposed, and wherein, in a top view of the first chip main surface, via connections of the first via array and via connections of the second via array are aligned.

* * * * *